(12) United States Patent
Fontana et al.

(10) Patent No.: US 7,706,160 B2
(45) Date of Patent: Apr. 27, 2010

(54) HIGH VOLTAGE GENERATOR OF THE DAC-CONTROLLED TYPE

(76) Inventors: Marco Fontana, Via Fontanelli, 10, Milano (IT) 20020; Mauro Pagliato, Via De Gasperi, 3, Bollate (IT) 20021; Chiara De Berti, Via Luigi Pulci, 12, Milano (IT) 20126; Marco Spinelli, Via Noce, 43, Perdifumo (IT) 84060; Davide Bitonti, Via Nuova, 43, Catanzaro (IT) 88100

( * ) Notice: Subject to any disclaimer, the term of this patent is extended or adjusted under 35 U.S.C. 154(b) by 698 days.

(21) Appl. No.: 11/463,260

(22) Filed: Aug. 8, 2006

(65) Prior Publication Data
US 2008/0037301 A1 Feb. 14, 2008

(51) Int. Cl.
*H02M 7/00* (2006.01)
(52) U.S. Cl. .................................................. 363/59
(58) Field of Classification Search .............. 363/59, 363/60; 327/536
See application file for complete search history.

(56) References Cited
U.S. PATENT DOCUMENTS
7,180,760 B2 * 2/2007 Varrichio et al. .............. 363/59

2003/0052729 A1 * 3/2003 Hsu et al. .................... 327/536
2006/0033442 A1 * 2/2006 D'Angelo ..................... 315/86

* cited by examiner

*Primary Examiner*—Bao Q Vu
*Assistant Examiner*—Jue Zhang
(74) *Attorney, Agent, or Firm*—Trop, Pruner & Hu, P.C.

(57) ABSTRACT

A high voltage generator of the DAC-controlled type, has an input terminal connected to a first voltage reference and an output terminal providing an output voltage and comprises at least a voltage control circuit and a charge pump circuit inserted, in series to each other, between the input and output terminals of the high voltage generator, and an output regulator connected to the output terminal of the high voltage generator and comprising at least a digital-to-analog converter or DAC. The output regulator further comprises at least an additional current regulation portion connected to the output terminal of the high voltage generator through a first resistive element of the output regulator as well to an enabling terminal which provides an enabling signal, the additional current regulation portion being supplied by a second voltage reference having a voltage level higher than a voltage level of the first voltage reference.

13 Claims, 10 Drawing Sheets

HIGH VOLTAGE GENERATOR OF THE DAC-CONTROLLED TYPE

BACKGROUND OF THE INVENTION

1. Field of the Invention

The present invention relates to a high voltage generator of the DAC-controlled type.

The invention particularly, but not exclusively, relates to a high voltage generator to be used in a non-volatile memory device and the following description is made with reference to this field of application for convenience of explanation only.

2. Description of the Related Art

As it is well known, different high voltage generators are used in the non-volatile integrated memory devices, for instance Flash NOR memory devices.

Such generators provide voltage signals having a level which lies outside a supply voltage range, normally ranking from a first voltage or power supply voltage Vdd and a second voltage or ground GND.

In essence, a high voltage generator for non-volatile memory devices is a generator of a supply voltage outside the Gnd . . . Vdd range, the generation of such supply voltage being obtained by means of a charge pump circuit or by means of an external supply reference and being regulated by means of a resistive voltage partition compared to a low voltage reference, as it will be explained in the following description.

A high voltage generator of a known type is very schematically shown in FIG. 1, globally indicated with 1. It substantially comprises a voltage control circuit 3 connected to a charge pump circuit 2, which provides at an output terminal OUT a high output voltage Vout, as desired.

The voltage control circuit 3 has an input terminal IN receiving a reference voltage VBG as well as first and second output terminals connected to respective first and second input terminals, I1 and I2, of the charge pump circuit 2.

More particularly, the voltage control circuit 3 comprises an operational amplifier 4 having a first input terminal, in particular a non-inverting one (+), connected to the input terminal IN, a second input terminal, in particular an inverting one (−) and an output terminal O1 connected, by means of an inverting buffer 5, to the first input terminal I1 of the charge pump circuit 2 as well as to an oscillator 6, having in turn an output terminal connected to the second input terminal I2 of the charge pump circuit 2 and providing thereto a frequency modulated signal f_mod. The inverting buffer 5 further provides a command signal STOP/GO to the first input terminal I1 of the charge pump circuit 2.

The reference voltage VBG currently used is a well known band-gap voltage and it is to be compared to a partition Vout*rho of the output voltage Vout. In this aim, the high voltage generator 1 further comprises a resistor divider 7 which is inserted between the output terminal OUT and ground GND and has a central node XP connected to the inverting input terminal (−) of the operational amplifier 4 which provides thereto a partition voltage Vpart.

Moreover, the resistor divider 7 comprises a first Rup and a second resistor Rdwn, connected, in series to each other, between the output terminal OUT and ground GND.

These resistors are sized in such a way that the following relation is verified:

$$Rdwn/(Rup+Rdwn)=rho$$

In this way, the high voltage generator 1 of FIG. 1 shows the following advantageous features:

- low current absorption from the output terminal OUT. In this aim, a high value for the total resistance of the resistor divider 7 (equal to Rup+Rdwn) is suitably chosen so that a small amount of current is drawn by the output terminal OUT; and
- low dependence on the process drift. In particular, the resistors Rup and Rdwn of the resistor divider 7 can have a stable partition ratio rho which is independent from the process drift and from the material physically realizing such resistors. Moreover, in this aim, a very high value can be chosen for the gain of the operational amplifier 4.

It is thus clear that the high voltage generator 1 provides an output voltage Vout having a voltage level which is approximately equal to VBG/rho and depends on an external load connected to the output terminal OUT, on the output resistance value of the charge pump circuit 2 and on the regulation accuracy.

In particular, the regulation obtained thanks to the voltage control circuit 3 can be:

- a digital one, by switching ON/OFF the charge pump circuit 2 on the basis of the command signal STOP/GO having a first value STOP and a second value GO corresponding to the conditions Vout>VBG/rho and Vout<VBG/rho, respectively, in turn corresponding to a switching off, respectively on, of the charge pump circuit 2; and
- an analog one, by modulating a working frequency of the charge pump circuit 2 on the basis of the frequency modulated signal f_mod provided by the oscillator 6.

Moreover, the high voltage generator 1 shown in FIG. 1 is of the DAC controlled type and further comprises a low voltage digital-to-analog converter or LV DAC 8 providing on a second bus 9B a regulation signal REG to the resistor divider 7.

The LV DAC 8 operates by a direct or virtual modulation of the partition of the output voltage Vout provided by the resistor divider 7, the partition value depending on an input digital signal, as will be explained in the following description.

More particularly, the LV DAC 8 has an input terminal ID connected to a control bus 9 and receiving therefrom a digital control signal N_Bin of k bit as well as an output terminal OD connected by the second bus 9B to the resistor divider 7, in particular to a modulable resistor Rdwn comprised therein, and providing thereto the regulation signal REG.

In this way, the resistance value of resistor divider 7 depends on the regulation signal REG and thus from the digital control signal N_Bin on the control bus 9, usually comprising a plurality of control values (in the example shown in the figure, $2^k$ values) which are established by a digital controller, for instance a microprocessor, not shown in the figure, connected to the control bus 9.

The LV DAC regulator 8 and the resistor divider 7 thus form an output regulator 8A connected to the output terminal OUT of the high voltage generator 1.

In essence, the high voltage generator 1 as a whole works as a DAC.

It should be remarked that a high voltage generator 1 can be also realized in a simple manner by connecting an operational amplifier to an appropriate external high voltage line, as schematically shown in FIG. 2.

To structurally and/or functionally equal elements with respect to the high voltage generator described with reference to FIG. 1, same reference numbers will be applied.

In particular, according to this modified embodiment, the voltage control circuit 3 comprises an operational amplifier 4 and the charge pump circuit 2 is substituted by a cascode transistor MOUT, for instance a MOS transistor of the N type, inserted between an external high voltage line Vpp and an output terminal OUT of the high voltage generator 1. The operational amplifier 4 is also connected to the external high voltage line Vpp and has an output terminal O1 connected to a control or gate terminal G of the cascode transistor MOUT.

As previously, the high voltage generator 1 further comprises a resistor divider 7 which is inserted between the output terminal OUT and ground GND and has a central node XP connected to the inverting input terminal (−) of the operational amplifier 4 which provides thereto a partition voltage Vpart.

Moreover, the resistor divider 7 comprises a first Rup and a second resistor Rdwn, connected, in series to each other, between the output terminal OUT and ground GND.

The high voltage generator 1 further comprises a low voltage digital-to-analog converter or LV DAC 8 having an input terminal ID connected to a control bus 9 and receiving therefrom a digital control signal N_Bin of k bit as well as an output terminal OD connected by a second bus 9B to the resistor divider 7, in particular to a modulable resistor Rdwn comprised therein, and providing thereto a regulation signal REG.

The LV DAC regulator 8 and the resistor divider 7 thus form an output regulator 8A connected to the output terminal OUT of the high voltage generator 1.

The high voltage generator 1 of FIG. 2 provides for an analog regulation thanks to the operational amplifier 4 which is supplied with an external high voltage, also indicate with Vpp for sake of simplicity, and drives the gate terminal G of the cascode transistor MOUT.

In any case, a DAC-controlled high voltage generator works in a voltage range—from a bottom level to a top level—being defined as follows:
the top level is a maximum voltage value for which the charge pump circuit 2 (or the cascode transistor MOUT, as driven by the voltage control circuit 3) can be considered as a voltage generator which is independent of the load applied thereto; and
the bottom level is tied to the condition wherein the voltage control circuit 3 is able to correctly compare the output voltage Vout and the band gap input voltage VBG.

For the scheme shown in FIG. 1, the voltage control circuit 3 cannot correctly work when Vout<VBG, being always rho<1 in a voltage divider.

The limitation of the bottom level is however not satisfactory when the high voltage generator 1 is used in non-volatile memory devices, in particular of the Flash NOR type, of new generation.

It is in fact known that new generation memory devices are realized according to technologies characterized by linear sizes and thicknesses more and more reduced as well as really low driving voltages.

In particular, the modify operations, i.e. the cell writing and erasing operations, are performed by using staircase voltages which should start as low as possible, substantially at a first level which is equal or even lower than the band gap input voltage VBG.

In the field of the non-volatile memory devices, the DAC-controlled high voltage generator is thus usually modified as shown in FIG. 3, globally and schematically indicated with 10. In particular, such high voltage generator 10 is used to provide—as output voltage Vout—a program voltage (usually labelled Vxp) for non-volatile memory cells.

To structurally and/or functionally equal elements with respect to the high voltage generators described with reference to FIGS. 1 and 2, same reference numbers will be applied.

The high voltage generator 10 thus comprises a charge pump circuit 2 having an input terminal I1 connected to a voltage control circuit 3 and an output terminal connected to the output terminal OUT of the high voltage generator 10.

The voltage control circuit 3 comprises an operational amplifier 4 having a first non-inverting input terminal (+) and a second inverting input terminal (−) as well as an output terminal O1 connected to an inverting buffer 5, which has in turn an output terminal X connected to the input terminal I1 of the charge pump circuit 2 and providing thereto a command signal STOP/GO.

The high voltage generator 10 also comprises a LV DAC regulator 8 having an input terminal ID connected to a control bus 9 and receiving therefrom a digital control signal N_Bin of k bit as well as an output terminal OD connected to the operational amplifier 4, in particular to the non inverting input terminal (+) and providing thereto a converted control voltage Vconv_LV, which is an analog conversion of the digital control signal N_Bin.

The high voltage generator 10 further comprises a measuring circuit or MEAS circuit 11A having an input terminal IM connected to the output terminal OUT and receiving therefrom the output voltage Vout as well as an output terminal OM connected to the inverting input terminal (−) of the operational amplifier 4 and providing thereto a measured voltage Vmeas.

Essentially, the MEAS circuit 11A detects the output voltage Vout and provides the measured voltage Vmeas which is substantially such output voltage Vout suitably reduced in order to lie within the supply range GND ... Vdd.

In this way, the operational amplifier 4 provides for a comparison between the converted control voltage Vconv_LV and the measured voltage Vmeas in order to decide whether the charge pump circuit 2 has to be switched on or off.

The LV DAC regulator 8 and the MEAS circuit 11A thus form an output regulator 8B connected to the output terminal OUT of the high voltage generator 1.

The high voltage generator 10 also comprises a discharge circuit 12 inserted between the voltage control circuit 3 and the output terminal OUT and comprising a logic gate 13 having a first input terminal connected to the voltage control circuit 3, namely to the output terminal X of the inverting buffer 5, a second input terminal IS receiving an enabling signal Up_Down and an output terminal connected to a control or gate terminal of a discharge transistor Mds, in turn inserted between the output terminal OUT and ground GND.

The discharge circuit 12 is enabled when the output voltage Vout has a voltage value which is higher than a desired one and provides for the discharging of the output terminal OUT.

It should be noted that such a discharge circuit 12 is needed only in case of a capacitive load applied to the output terminal OUT (or in case of a load comprising a resistive element which is not connected to ground GND). In this case the enabling signal Up_Down, provided by an external control circuit, is usually enabled when the voltage required by the DAC (i.e. the digital value of the signal N_Bin) commutes to a lower value.

In the following description, the charge pump circuit is considered as comprising a discharge circuit, if needed, the discharge circuit being activated when the charge pump circuit is off.

More particularly, as shown in FIG. 4A, the LV DAC regulator 8 comprises a multiple current generator 14 having an input terminal connected to the input terminal ID of the LV DAC regulator 8 and thus to the control bus 9, receiving therefrom the digital control signal N_Bin and an output terminal connected to the output terminal OD of the LV DAC regulator 8, as well as to a current/voltage converter 15, which has a resistance value Rout.

In this way, an output current Ird*N provided by the multiple current generator 14 on the basis of the digital control signal N_Bin is converted by the current/voltage converter 15 into the control voltage Vconv_LV and provided to the output terminal OD of the LV DAC regulator 8.

The multiple current generator 14 is also connected to a reference current/voltage generator 16, in turn connected to a band gap terminal BGr and receiving therefrom a band gap voltage VBG. The reference current/voltage generator 16 provides a reference voltage Viref_DAC to the reference input terminal IDR of the LV DAC regulator 8.

More particularly, as it will be clear in the following description, the reference current/voltage generator 16 generates a reference current Ird and associates thereto the reference voltage Viref_DAC, which is then used by the multiple current generator 14 in order to generate a current which a multiple or a submultiple of this reference current Ird by a factor N [which is an integer number associated to the digital control signal N_Bin]. Moreover, the final obtained current is then used to generate the converted control voltage Vconv_LV by the resistance value Rout of the current/voltage converter 15.

A possible circuital implementation of the reference voltage generator 16 and of the multiple current generator 14 is shown in greater detail in FIG. 4B.

The reference current/voltage generator 16 comprises an operational amplifier 17 having a first inverting input terminal (−) connected to the band gap terminal BGr, a second non-inverting input terminal (+) connected to an internal node Xbg as well as an output terminal connected to the reference input terminal IDR of the multiple current generator 14.

The reference current/voltage generator 16 further comprises a pull-down or evaluation resistor Rdwn, inserted between the internal node Xbg and ground GND, as well as a pull-up transistor Mup, inserted between the voltage supply Vdd and the internal node Xbg and having a control or gate terminal connected to the output terminal of the operational amplifier 17 and thus to the reference input terminal IDR of the multiple current generator 14.

It should be noted that the non-inverting input terminal (+) of the operational amplifier 17 provides to the internal node Xbg a voltage BG_copy_R which is a copy of the band gap voltage VBG, a reference current Ird flowing from the pull-up transistor Mup being thus equal to:

$$Ird = VBG/Rdwn$$

Moreover, the multiple current generator 14 comprises a plurality of pull-up/pull-down transistor pairs, inserted between the reference input terminal IDR and the output terminal OD of the LV DAC regulator 8, these transistor pairs being as many as the digital size K of the digital control signal N_Bin is.

In particular, each transistor pair comprises a pull-up transistor Mupi and a pull-down transistor Mdwi (being i=0 . . . k), inserted, in series to each other, between the supply voltage reference Vdd and the output terminal OD, the pull-up transistor Mupi having a control or gate terminal connected in a mirror configuration to the supply voltage reference Vdd while the pull-down transistor Mdwi has its control or gate terminal IDi connected to the control bus 9 and receiving therefrom a corresponding digital control value N_Bin_i.

In essence, the multiple current generator 14 comprises a plurality of current mirrors to provide at the output terminal OD (which is connected to the current/voltage converter 15, as previously explained) a final output current Ird*N depending on the digital control signal N_Bin on the control bus 9, thus obtaining the converted control voltage Vconv_LV.

A circuital implementation of the MEAS circuit 11A is schematically shown in FIG. 4C.

More particularly, the MEAS circuit 11A comprises an operational amplifier 18 having its first non-inverting input terminal (+) connected to a Band Gap terminal BGm and receiving therefrom a Band Gap voltage VBG (this Band Gap terminal BGm being the input terminal IN of the high voltage generator 10), a second inverting input terminal (−) connected to an internal node XbgM and an output terminal connected to a control or gate terminal of a measuring transistor Mmeas, being in turn inserted between the internal node XbgM and the output terminal OM of the MEAS circuit 11A. It should be noted that the inverting input terminal (−) of the operational amplifier 18 provides to the internal node XbgM a voltage BG_copy_M which is a copy of the band gap voltage VBG, generated in a dual manner with respect to the voltage BG_copy_R provided to the internal node Xbg of the reference current/voltage generator 16 connected to the LV DAC regulator 8.

The MEAS circuit 11A further comprises a pull-up or measuring resistor Rup inserted between its input terminal IM and the internal node XbgM, a measuring current Imeas flowing through the measuring resistor Rup and the measuring transistor Mmeas, being in series to each other.

Finally, the MEAS circuit 11A comprises a current/voltage converter 19, inserted between the output terminal OM and ground GND and providing to this output terminal OM the measured voltage Vmeas.

In summary, the signals provided by the DAC regulator 8 and by the MEAS circuit 11 are generated according to the following formula:

$$Vconv\_LV = N*VBG*Rout/Rdwn$$

being N an integer number associated to the digital control signal N_Bin of the control bus 9, Rout the resistance of the current/voltage converter 19, (which must match as better as possible the Rout of the I/V converter 15 in the DAC 8) and Rdwn is the resistance value of the evaluation resistor.

$$Vmeas = (Vout - VBG)*Rout/Rup$$

being Rup a resistance value of the measuring resistor.

It is thus clear that the switching of the operational amplifier 4 corresponds to the following condition:

$$Vconv\_LV = Vmeas \rightarrow Vout = VBG*(1 + k*Rup/Rdwn)$$

In other words, the high voltage generator 10 shown in FIG. 3 provides for a regulation of the evaluation resistor Rdwn based on a fraction of its resistance value, according to the integer number N associated to the digital control signal N_Bin.

Also in this case, the regulation becomes difficult when the output voltage Vout reaches the band gap voltage VBG and cannot be realized when Vout<VBG, not overcoming the above described problem.

Also known are high voltage generators comprising a main DAC regulator in parallel to other regulators, each of which is dedicated to an extra regulation value and being activated according to the value of additional bits of the digital control signal N_Bin on the control bus 9.

This approach leads to a rather complex architecture that cannot be considered as a true DAC-controlled high voltage generator extended below the VBG voltage.

BRIEF SUMMARY OF THE INVENTION

An embodiment of the present invention is directed to a DAC-controlled high voltage generator ensuring a correct regulation of an output voltage also in case of voltage values which are lower that a band gap voltage, thus overcoming the limits which still affect the generators realized according to the prior art.

The DAC-controlled high voltage generator comprises a current circuit associated to the resistive elements of the output regulator of the high voltage generator and able to track their changes.

The high voltage generator of the DAC-controlled type has an input terminal connected to a first voltage reference and an output terminal providing an output voltage and comprises:

at least a voltage control circuit and a charge pump circuit inserted, in series to each other, between the input and output terminals of the high voltage generator, an output regulator connected to the output terminal of the high voltage generator and comprising at least a digital-to-analog converter or DAC, wherein the output regulator further comprises at least an additional current regulation portion connected to the output terminal of the high voltage generator through a first resistive element of the output regulator as well to an enabling terminal which provides an enabling signal, the additional current regulation portion being supplied by a second voltage reference having a voltage level higher than a voltage level of the first voltage reference.

According to one embodiment, the output regulator further comprises a resistor divider inserted between the output terminal of the high voltage generator and a third voltage reference and comprising the first resistive element and a second resistive element interconnected at a central node in turn connected to the voltage control circuit and the additional current regulation portion comprises at least a current generator inserted between the second voltage reference and the central node of the resistor divider.

According to a further embodiment, the additional current regulation portion further comprises a switch which is inserted between the current generator and the central node of the resistor divider and connected to the enabling terminal, the switch being controlled by the enabling signal.

According to yet another embodiment, the DAC of the output regulator has an input terminal connected to a control bus and receiving therefrom a digital control signal and an output terminal connected by a second bus to the second resistive element which is modulable on the basis of a regulation signal received from the second bus, the enabling signal is an extension bit of the digital control signal provided by a control logic.

According to yet another embodiment, the output regulator further comprises a measuring circuit having an input terminal connected to the output terminal of the high voltage generator and an output terminal connected to the voltage control circuit and in turn comprises:

an operational amplifier having a first input terminal connected to the input terminal of the high voltage generator, a second input terminal connected to an internal node and an output terminal;

a measuring transistor inserted between the internal node and the output terminal of the measuring circuit and having a control terminal connected to the output terminal of the operational amplifier;

the first resistive element being inserted between the input terminal of the measuring circuit and the internal node; and a current/voltage converter, inserted between the output terminal of the measuring circuit and the third voltage reference and providing to this output terminal a measured voltage, the measuring circuit further comprising the additional current regulation portion, in turn including first and second transistors, inserted, in series to each other, between the second voltage reference and the internal node and having respective control terminals connected to a reference input terminal of the measuring circuit and to the enabling terminal of the additional current regulation portion, respectively.

According to yet another embodiment, the DAC comprises a multiple current generator connected to a reference current/voltage generator and providing an output current which, on the basis of the digital control signal, is converted by a current/voltage converter into a converted control voltage and provided to the output terminal of the DAC, the reference current/voltage generator comprising:

an operational amplifier connected to the reference input terminal of the multiple current generator and providing thereto a reference voltage;

an evaluation resistor, inserted between an internal node and the third voltage reference, and a pull-up transistor, inserted between the second voltage reference and the internal node and having a control terminal connected to the output terminal of the operational amplifier and thus to the reference input terminal of the multiple current generator, a reference current flowing through the series of the evaluation resistor and pull-up transistor.

A current provided by the additional current regulation portion is chosen as equal to a multiple of the reference current according to the following relation:

$$I\text{-}DV = m^*Ird$$

being I-DV the current provided by the additional current regulation portion and Ird the reference current.

The characteristics and advantages of the high voltage generator according to the invention will be apparent from the following description of an embodiment thereof given by way of indicative and non-limiting example with reference to the annexed drawings.

DETAILED DESCRIPTION OF THE INVENTION

With reference to such figures, and in particular to FIG. 5, a high voltage generator realized according to one embodiment of the present invention will be hereinafter described, globally indicated with 20.

To structurally and/or functionally equal elements with respect to the generators described in the prior art section, same reference numbers will be applied.

Figure 5:
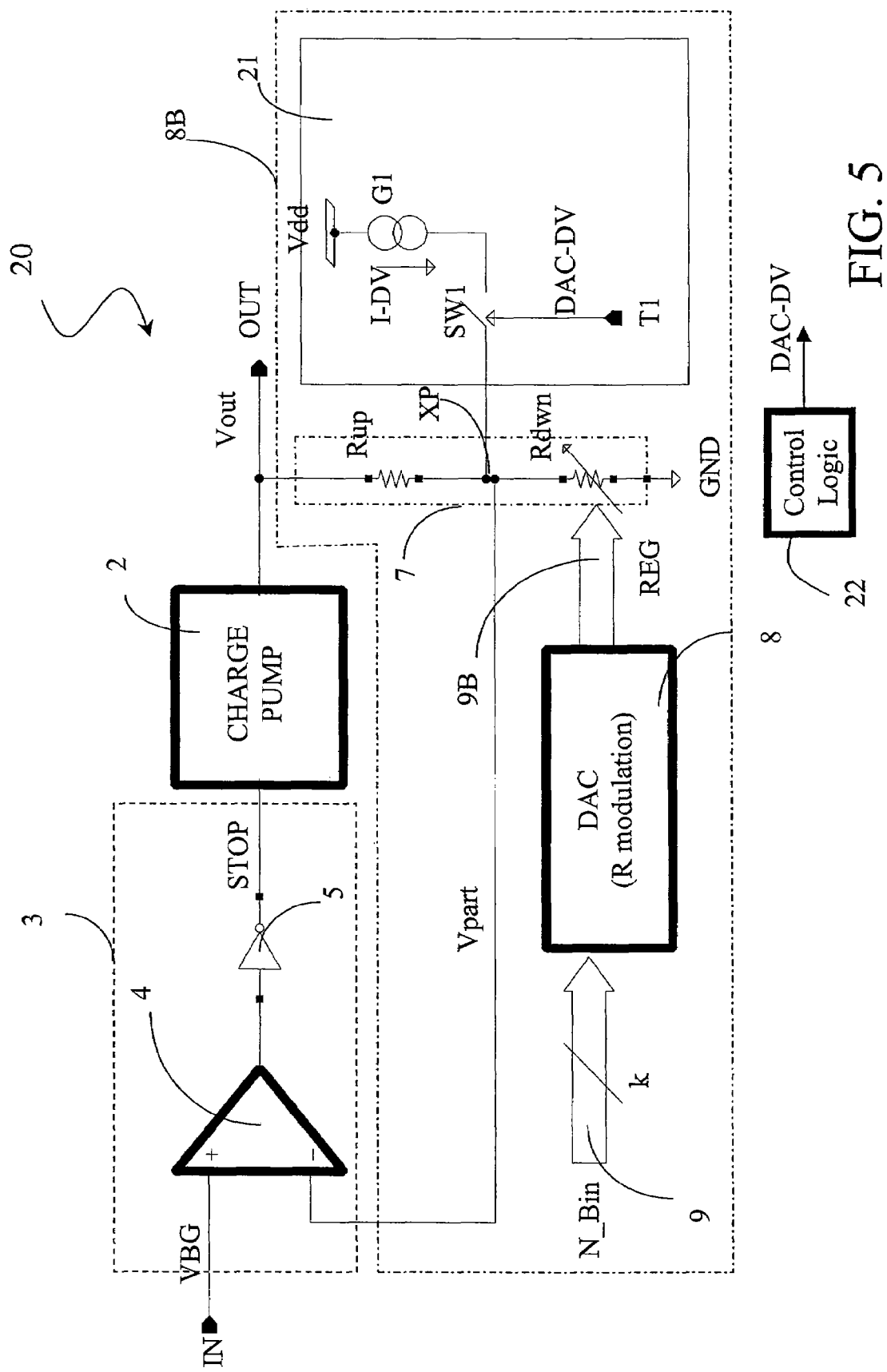
FIG. 5 schematically shows a high voltage generator realized according to a first embodiment the present invention.

In particular, the high voltage generator 20 shown in FIG. 5 comprises a voltage control circuit 3 having an input terminal IN receiving a reference voltage VBG and being connected to a charge pump circuit 2, which provides a high output voltage Vout at an output terminal OUT of the high voltage generator 20.

More particularly, the voltage control circuit 3 comprises an operational amplifier 4 having a first input terminal, in particular a non-inverting one (+), connected to the input terminal IN, a second input terminal, in particular an inverting one (−) and an output terminal O1 connected, by means of an inverting buffer 5, to the charge pump circuit 2.

As for the prior art generators, the reference voltage VBG preferably is a well known band-gap voltage and it is to be compared to a partition of the output voltage Vout. Also, the charge pump circuit is considered as comprising a discharge circuit, if needed, the discharge circuit being activated when the charge pump circuit is off (state STOP).

In this aim, the high voltage generator 1 comprises an output regulator 8C connected to its output terminal OUT and comprising a resistor divider 7 connected to a low voltage digital-to-analog converter or DAC 8.

In particular, the resistor divider 7 is inserted between the output terminal OUT and a first voltage reference or ground GND and has a central node XP connected to the inverting input terminal (−) of the operational amplifier 4, providing thereto a partition voltage Vpart.

Moreover, the resistor divider 7 comprises a first or pull-up resistor Rup and a second or pull-down resistor Rdwn, connected, in series to each other, between the output terminal OUT and ground GND.

The DAC 8 having an input terminal ID connected to a control bus 9 and receiving therefrom a digital control signal N_Bin of k bit as well as an output terminal OD connected by a second bus 9B to the resistor divider 7, in particular to the pull-down resistor Rdwn which is modulable on the basis of a regulation signal REG received from the second bus 9B.

Advantageously, the output regulator 8C comprises an additional current regulation portion 21 supplied by a second voltage reference Vdd, in particular a general voltage reference which is external to the high voltage generator 20 and has a voltage level which is higher than the band gap voltage VBG, and connected to the central node XP of the resistor divider 7.

As it will be clear from the following description, the additional current regulation portion 21, when suitably activated, provides a current to the central node XP and enables the pull-up resistor Rup to act as a pull-down one, thus decrementing the output voltage (Vout) regulation.

More in detail, as shown in FIG. 5, the additional current regulation portion 21 has a very simple construction and comprises a current generator G1 and a switch SW1 inserted, in series to each other, between the external voltage reference Vdd and the central node XP of the resistor divider 7.

The additional current regulation portion 21 also has an enable terminal T1 connected to the switch SW1 and receiving an enabling signal DAC-DV, in particular provided as an extension bit of the digital control signal N_Bin by a control logic 22.

As for the operation of the output regulator 8C comprising the additional current regulation portion 21 according to an embodiment of the invention, it is to be noted that when the current generator G1 is activated by the enabling signal DAC-DV, the pull-up resistor Rup can act as a pull-down resistor, thus extending the correct operation of the high voltage generator 20 also when the output voltage Vout is lower that the band gap voltage VBG, and, at least theoretically, also when it is lower than 0. In particular, this latter case corresponds to the condition STOP of the charge pump circuit 2, when the output voltage Vout is discharged thanks to the connection to a negative charge pump.

It is thus clear that, advantageously according to an embodiment of the invention, the inferior limit value of the regulation provided by the output regulator 8C is reached when the pull-down resistor Rdwn is modulated to its maximum value.

Moreover, when such a high maximum value of the pull-down resistor Rdwn is sufficiently high (as it is, in practical application), the current flowing through this resistor is negligible and the inferior limit value corresponds to the following condition:

$$I\text{-}DV=(VBG-Vout)/Rup$$

being I-DV a current provided by the current generator G1

It can be shown that the activation of the current generation G1 provides for a decreasing DV of the output voltage Vout, independent on the value associated to the digital control signal N_Bin.

In this way, a high voltage generator 20 having an extended regulation range, in particular also below a voltage value equal to the band gap voltage VBG, without affecting the regulation in granularity of the DAC, the proposed solution being thus usable in various operational conditions, in particular within a non-volatile memory device.

Figure 6:
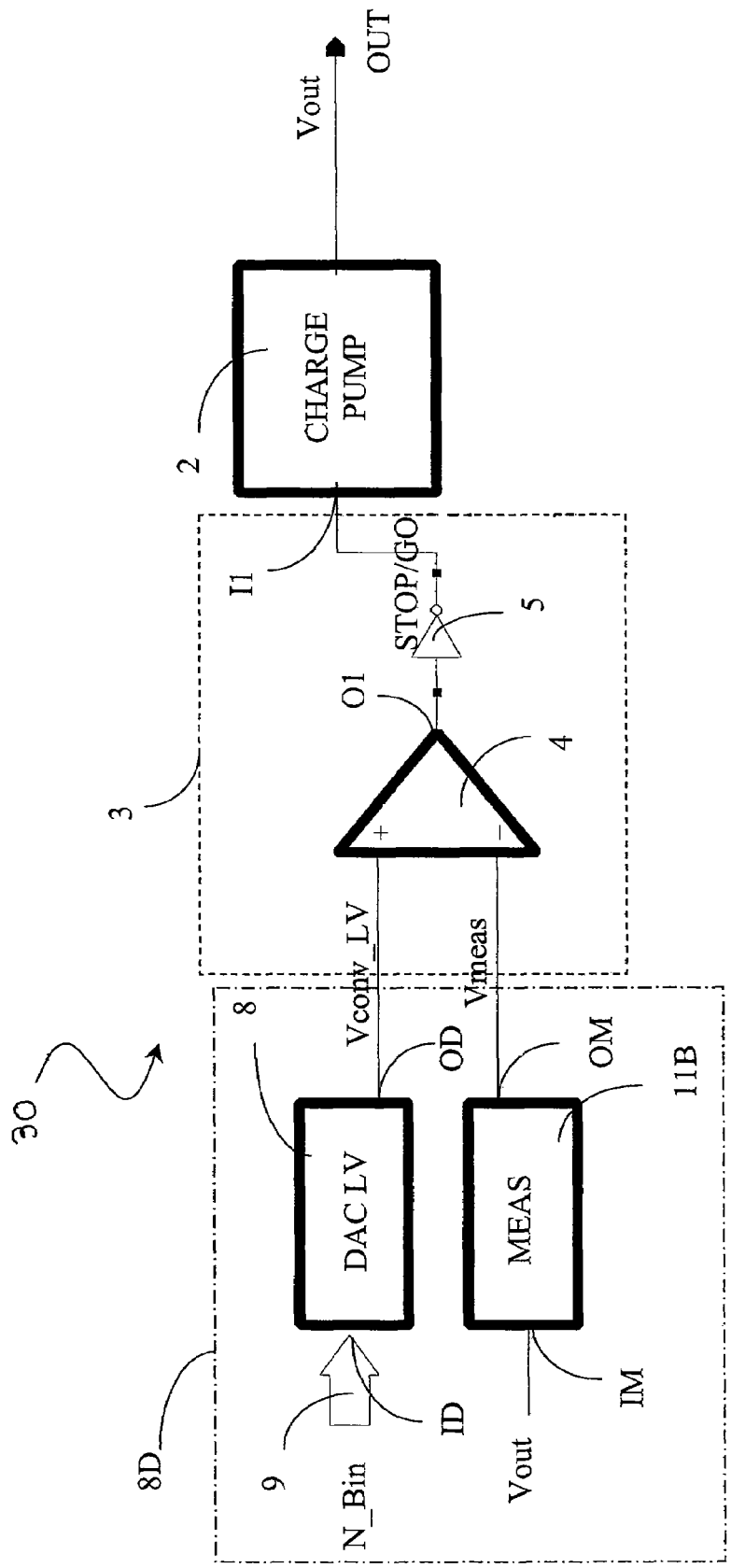
FIG. 6 schematically shows a high voltage generator realized according to a second embodiment of the present invention.

Advantageously, a second embodiment of a high voltage generator 30 is shown in FIG. 6.

According to this embodiment, the high voltage generator 30 comprises an output regulator 8D in turn including the DAC regulator 8 and a MEAS circuit 11B connected to the operational amplifier 4 of the voltage control circuit 3.

Figure 7:
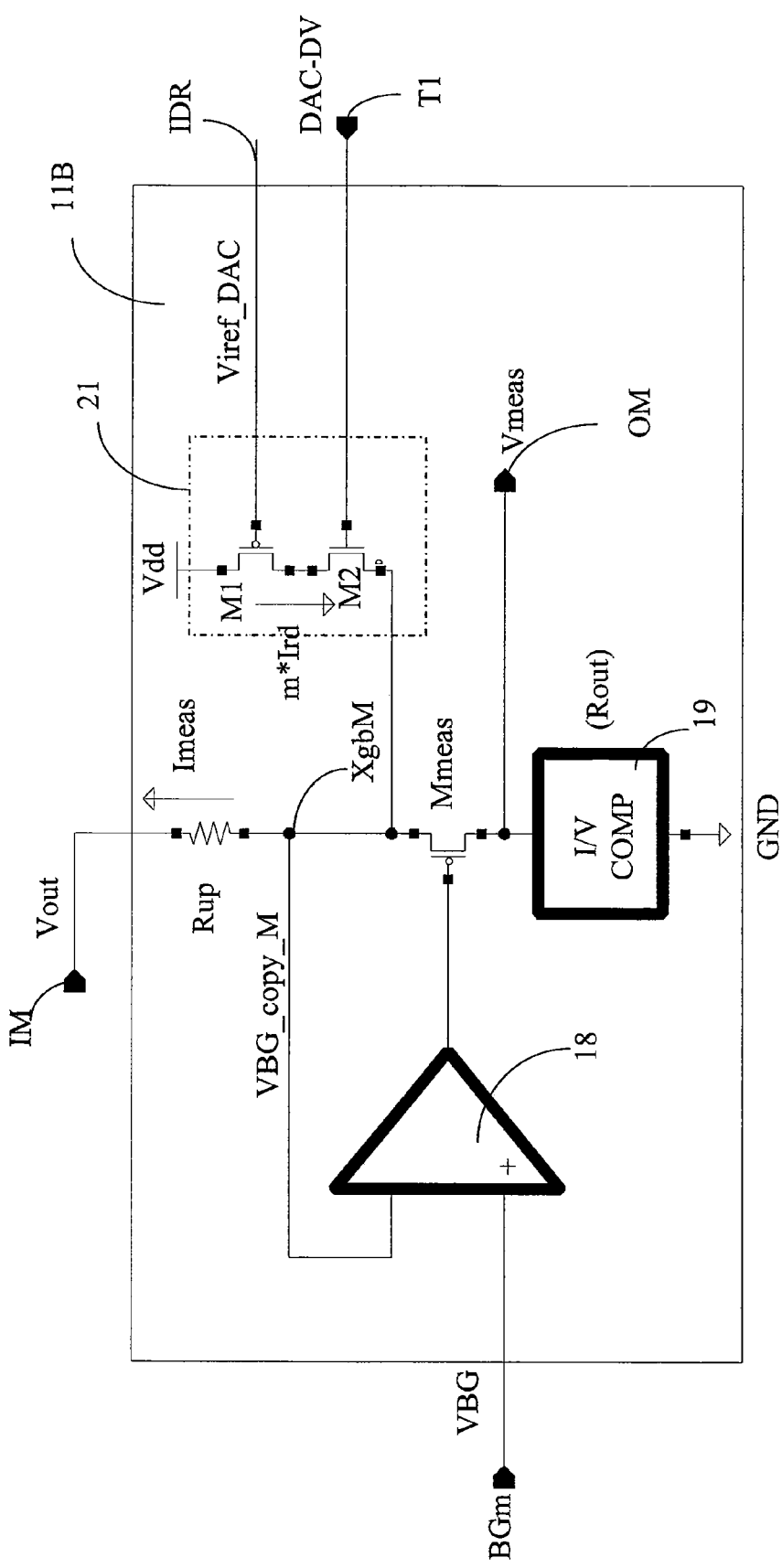
FIG. 7 schematically shows details of a measuring circuit of the generator shown in FIG. 6.

As shown in FIG. 7, the MEAS circuit 11B comprises an operational amplifier 18 having its first non-inverting input terminal (+) connected to a band gap terminal BGm and receiving therefrom a band gap voltage VBG (this band gap terminal BGm being the input terminal IN of the high voltage generator 20), a second inverting input terminal (−) connected to an internal node XbgM and an output terminal connected to a control or gate terminal of a measuring transistor Mmeas, being in turn inserted between the internal node XbgM and the output terminal OM of the MEAS circuit 11B, the inverting input terminal (−) of the operational amplifier 18 providing to the internal node XbgM a voltage BG_copy_M which is a copy of the band gap voltage VBG.

The MEAS circuit 11B further comprises a pull-up or measuring resistor Rup inserted between its input terminal IM and the internal node XbgM, a measuring current Imeas flowing through the measuring resistor Rup and the measuring transistor Mmeas, being in series to each other.

Moreover, the MEAS circuit 11B comprises a current/voltage converter 19, inserted between the output terminal OM and ground GND and providing to this output terminal OM the measured voltage Vmeas.

Advantageously, the MEAS circuit 11B also comprises the additional current regulation portion 21, inserted between an external voltage supply Vdd and the internal node XbgM and connected to the reference input terminal IDR of the MEAS circuit 11B, as well as to an enabling terminal T1 receiving the enabling signal DAC-DV.

More particularly, the additional current regulation portion 21 comprises a first and second transistors, M1 and M2, inserted, in series to each other, between the external voltage supply Vdd and the internal node XbgM and having respective control or gate terminals connected to the reference terminal IDR and to the enabling terminal T1, respectively.

In this way, the transistors M1 and M2 provides a current I-DV which should able to "track" the process drift of the resistors Rup and Rdwn.

In order to do so, the current I-DV provided by the additional current regulation portion 21 is chosen as equal to a multiple of the reference current Ird:

$$I\text{-}DV = m^*Ird$$

Figure 4A:
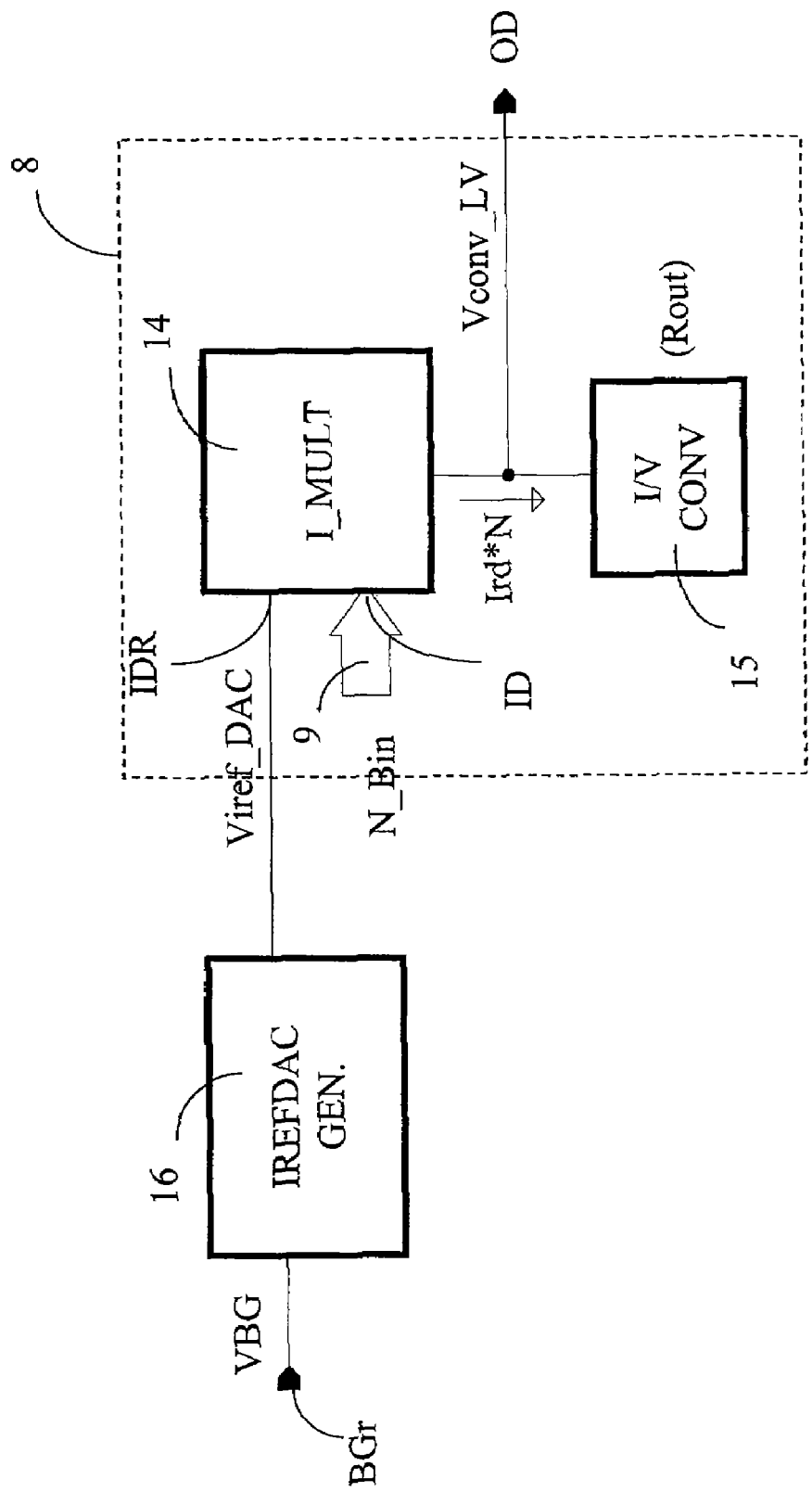
FIGS. 4A-4C schematically show further details of the high voltage generator of FIG. 3.
Figure 4B:
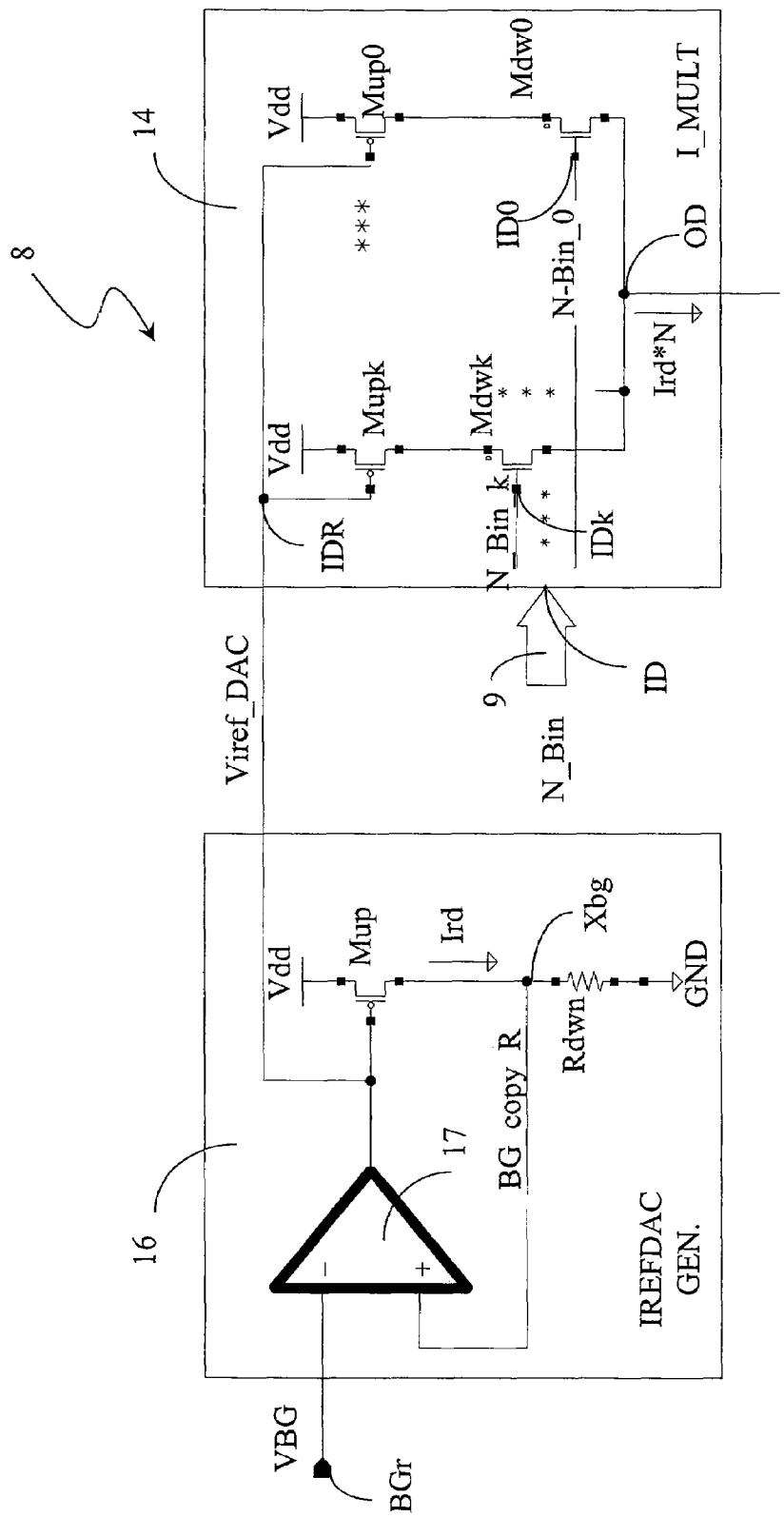
Figure 4C:
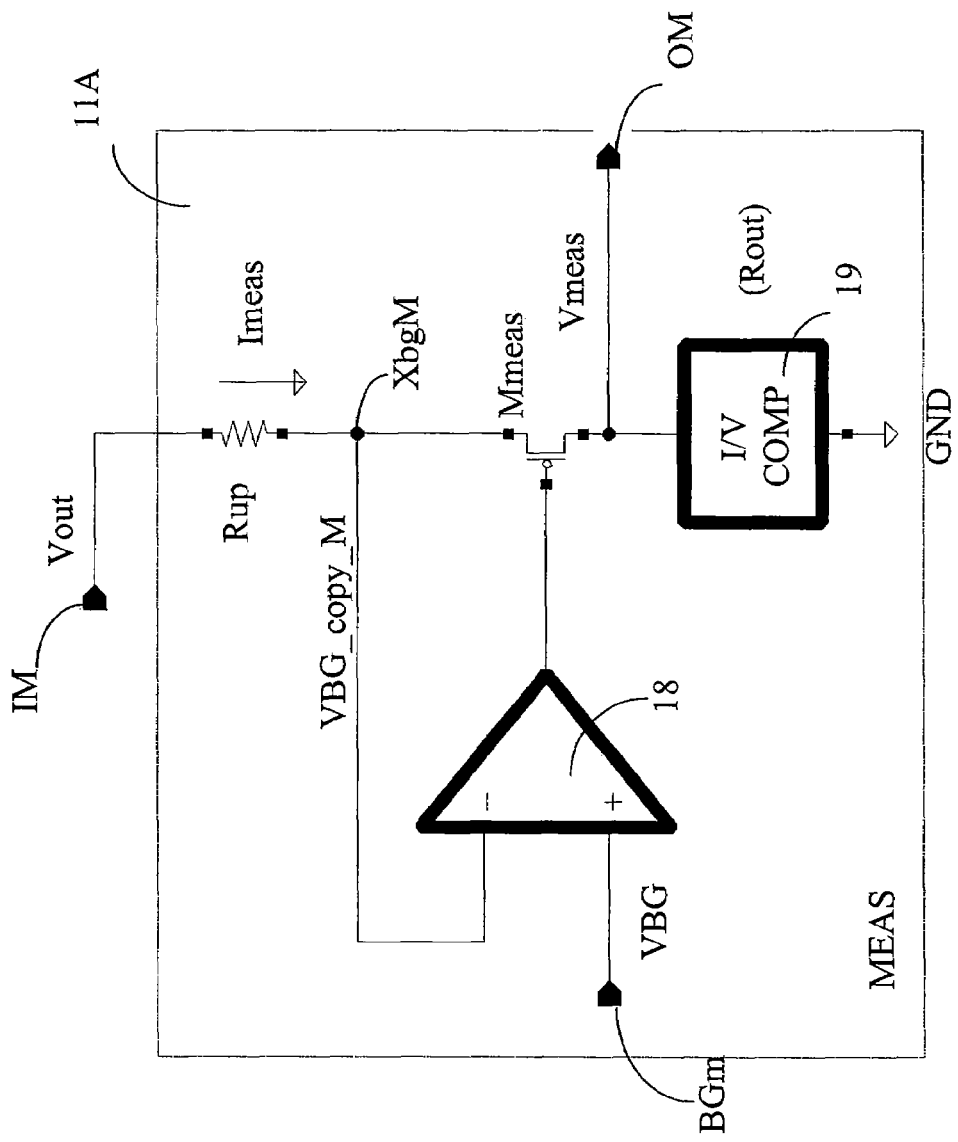

In fact, the reference current Ird follows the pull-down resistor Rdwn, being equal to:

$$Ird = VBG/Rdwn$$

as previously explained with reference to the prior art generator shown in the prior art section with reference to FIGS. 4A-4C. More particularly, it has been described that the DAC 8 comprises a multiple current generator 14 connected to a reference current/voltage generator 16 and providing an output current Ird*N which, on the basis of the digital control signal N_Bin, is converted by a current/voltage converter 15 into a converted control voltage Vconv_LV and provided to an output terminal OD of the DAC 8.

Furthermore, the reference current/voltage generator 16 comprises an operational amplifier 17 connected to the reference input terminal IDR of the multiple current generator 14 and providing thereto a reference voltage Viref_DAC and a pull-down or evaluation resistor Rdwn, inserted between an internal node Xbg and ground GND, as well as a pull-up transistor Mup, inserted between the voltage supply Vdd and the internal node Xbg and having a control or gate terminal connected to the output terminal of the operational amplifier 17 and thus to the reference input terminal IDR of the multiple current generator 14, a reference current Ird flowing through the series of the evaluation resistor Rdwn and pull-up transistor Mup.

It should be remarked that, advantageously according to an embodiment of the invention, the reference voltage Viref_DAC, already used by the used by the multiple current generator 14, is now also used to generate the current I-DV, this current being also able to work in opposition to the measuring current Imeas.

In this way, the measuring current Imeas is then used as a pull-down in order to guarantee a correct operation of the high voltage generator 30 comprising the MEAS circuit 11B also for an output voltage Vout lower than the band gap voltage VBG.

In order to quantify the operation of the additional current regulation portion 21, it is to be considered that the "triggering" condition of the operational amplifier 4 corresponds to the following relation:

$$Vconv\_LV = Vmeas$$

In particular, the converted control voltage Vconv_LV issued from the LV DAC regulator 8 is equal (as for previously) to:

$$Vconv\_LV = N^*VBG^*Rout/Rdwn$$

The measured voltage Vmeas is now equal to:

$$Vmeas = ((Vout - VGB)/Rup + m^*Ird)^*Rout$$
$$= ((Vout - VGB)/Rup + m^*VGB/Rdwn)^*Rout$$

The above triggering condition now corresponds to:

$$(Vout-VGB)/Rup + m^*VBG/Rdwn = N^*VBG/Rdwn$$

and thus $$Vout = VBG^*(1+(N-m)^*Rup/Rdwn)$$

By comparing the equation defining the output voltage Vout for the high voltage generator 10 according to the prior art as shown in FIGS. 3, 4A-4C and the high voltage generator 30 according to an embodiment of the invention it can be immediately verified that the additional current regulation portion 21 and in particular the current I-DV provides for a shift DV of the output voltage Vout being equal to:

$$DV = VBG^*m^*Rup/Rdwn$$

where Rup and Rdwn work "by ratio".

Figure 1:
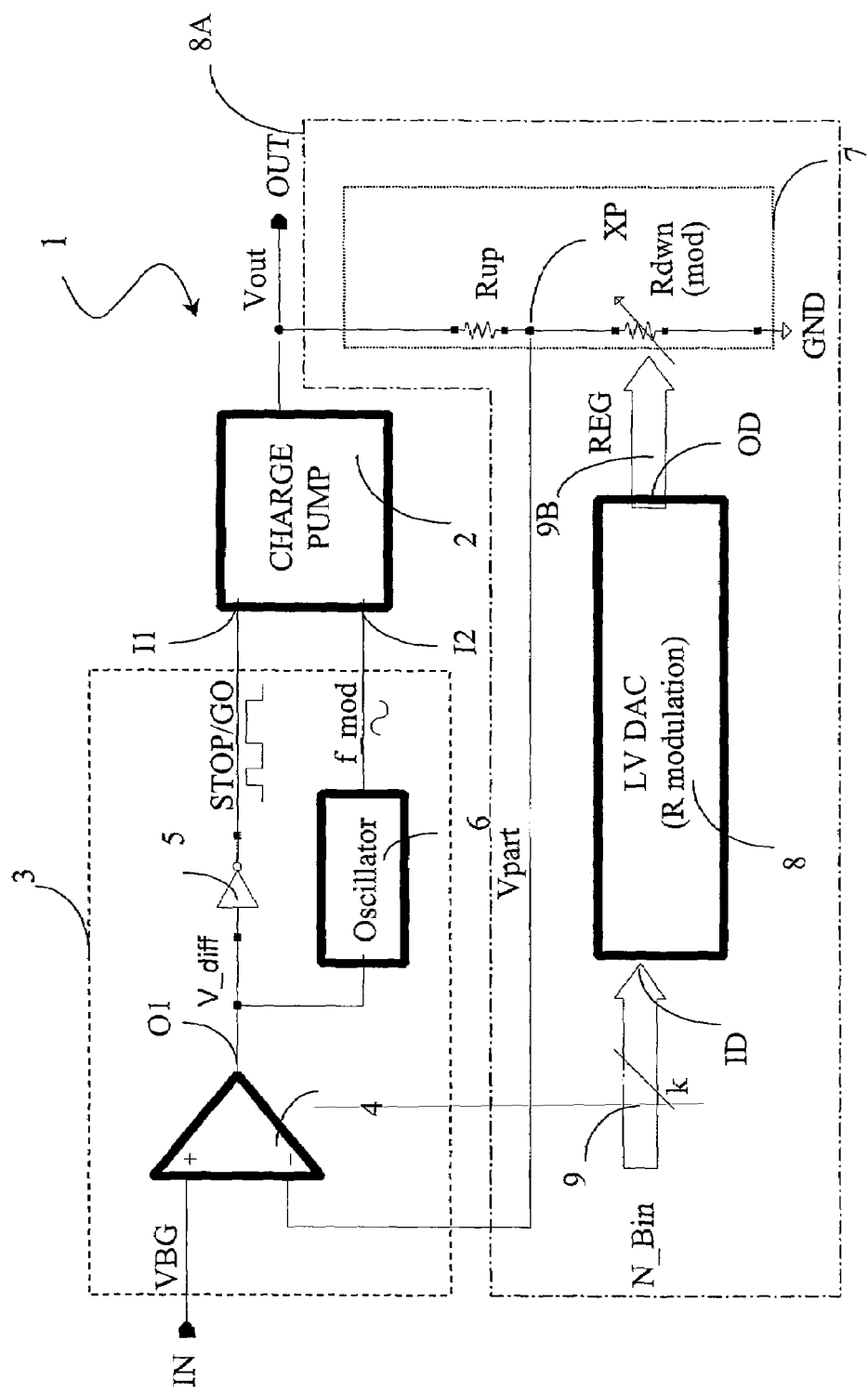
FIG. 1 schematically shows a first embodiment of a high voltage generator realized according to the prior art.
Figure 2:
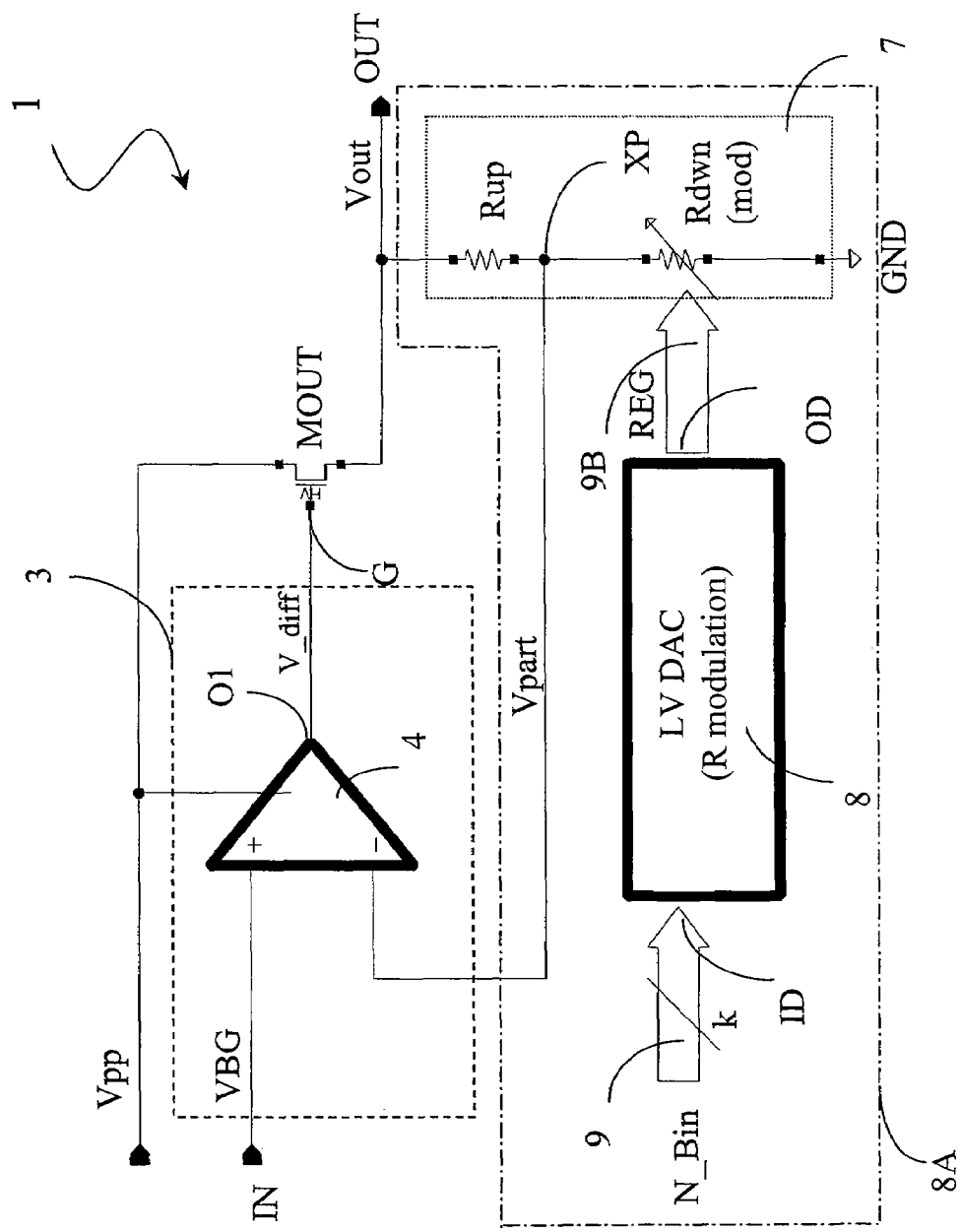
FIG. 2 schematically shows a second embodiment of a high voltage generator realized according to the prior art.
Figure 3:
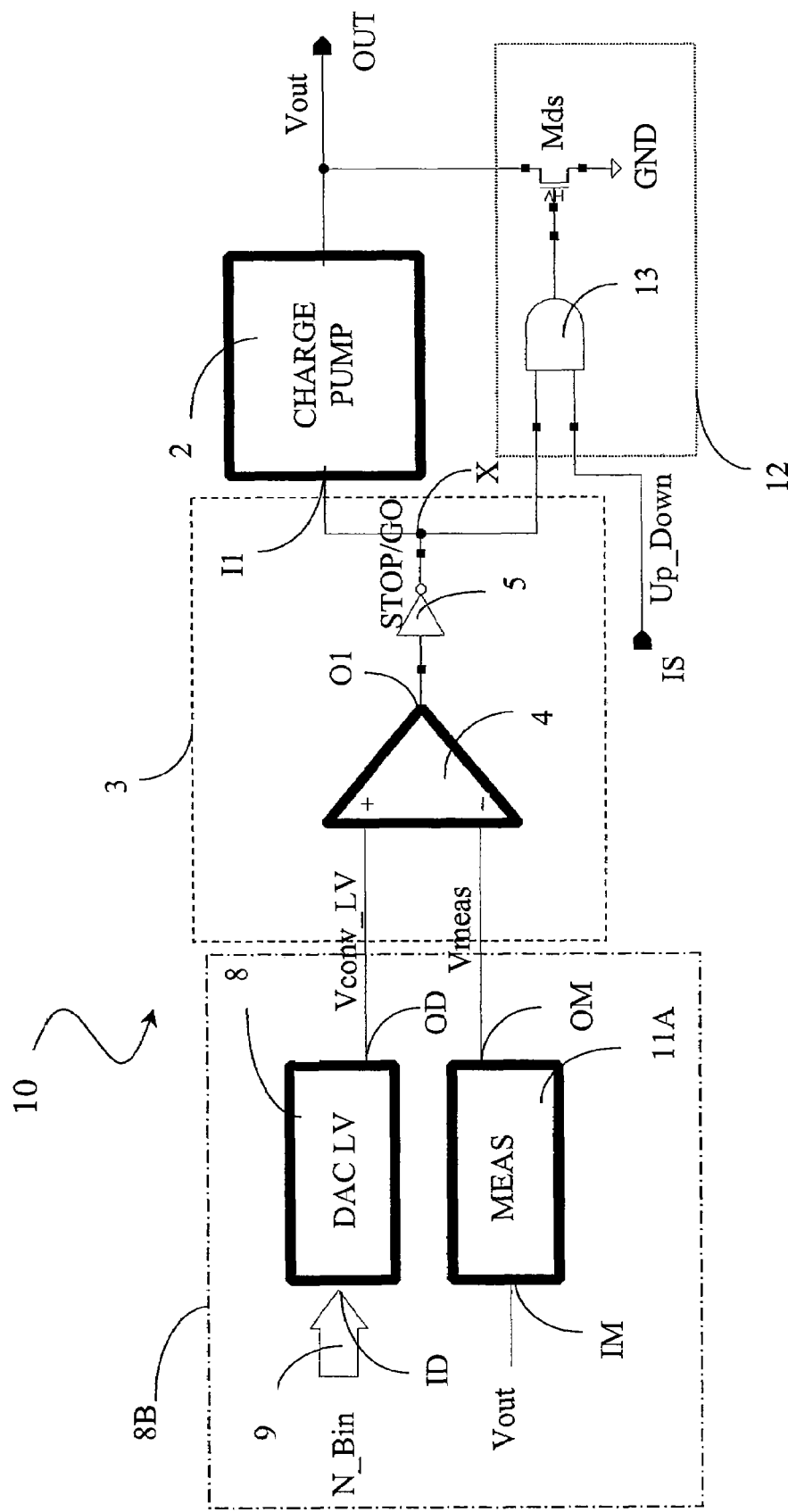
FIG. 3 schematically shows a third embodiment of a high voltage generator realized according to the prior art.
Figure 8A:
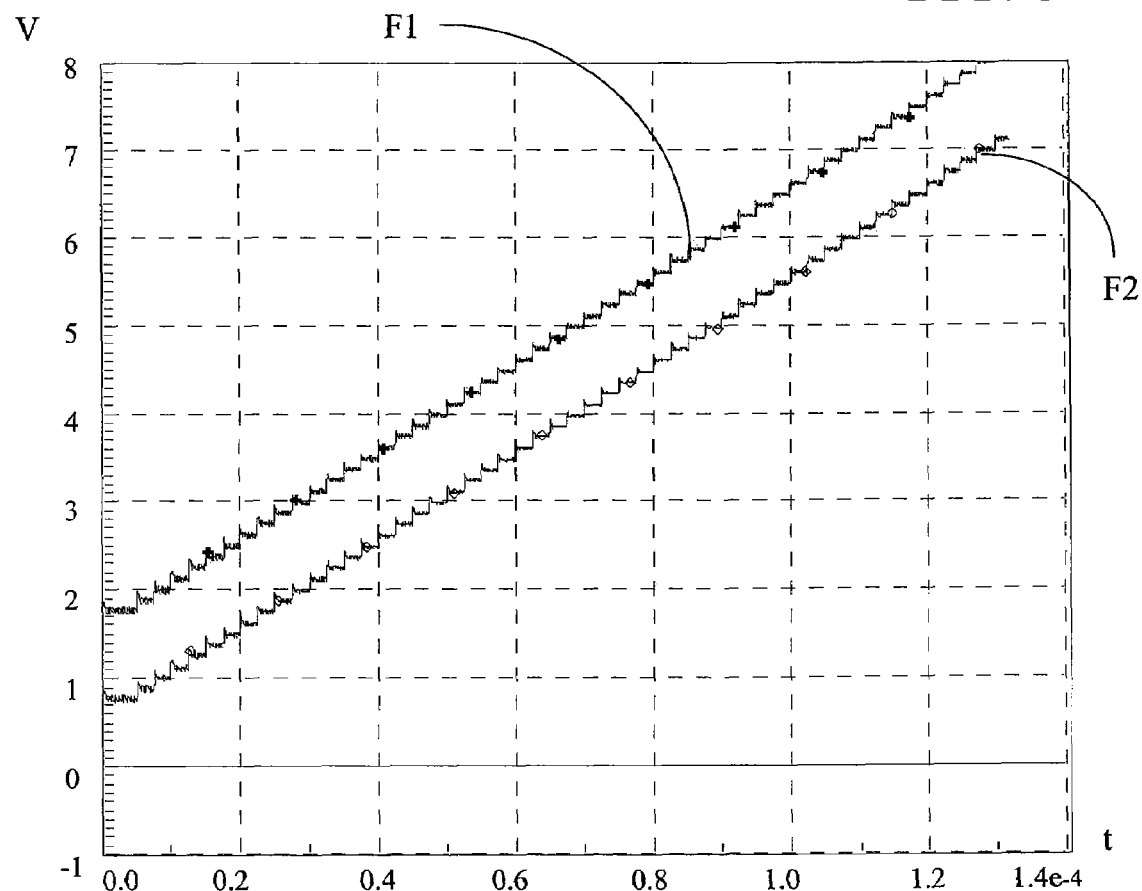
FIGS. 8A and 8B schematically show the results of simulations carried out on a high voltage generator realized according to an embodiment the present invention compared with a high voltage generator realized according to the prior art.
Figure 8B:
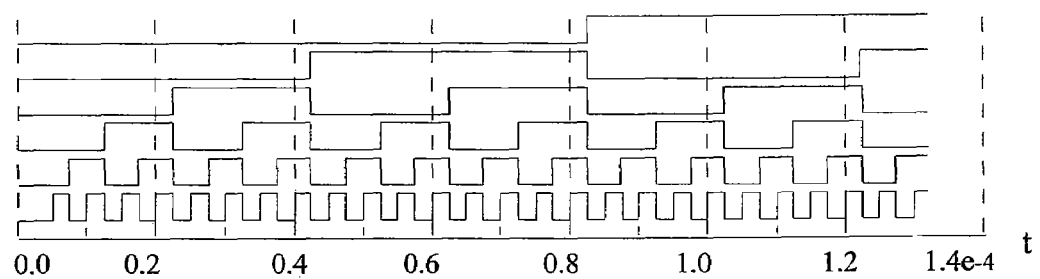

A simulation of the high voltage generator 30 according to the second embodiment of the present invention has been carried out by using the tool Eldo and compared by a simulation of the high voltage generator 10 according to the prior art as shown in FIG. 3. The results of these simulations are shown in FIGS. 8A and 8B.

In particular, the high voltage generator 10 has been connected by a charge pump circuit 2 and it has been driven by the following staircase input sequence: N_Bin=0 . . . 50, with a low value equal to 1.75V and a regulation step width of 125 mV. The curve F1 has been obtained for the output voltage Vout.

The high voltage generator 30 has been simulated for the same values of the digital control signal N_Bin, the curve F2 having been obtained for a current I-DV in such a way to obtain a DV=1V and thus an extension of the regulation range down to 0.75V.

In conclusion, advantageously, the proposed high voltage generator is of the DAC-controlled type and allows the regulation of an output voltage Vout also lower than a band gap voltage VBG.

In doing so, a current "tracking" the changes of the pull-up resistor Rup and pull-down resistor Rdwn is provided.

The proposed solution is very simple and inexpensive, using only a current generator and a switch (first embodiment) or a pair of MOS transistors suitably controlled (second embodiment).

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A DAC-controlled high voltage generator, comprising:
an input terminal connected to a first voltage reference;
an output terminal providing an output voltage;
a voltage control circuit and a charge pump circuit connected, in series to each other, between the input and output terminals of the high voltage generator;
an output regulator connected to the output terminal of the high voltage generator and including:
a first resistive element;
a digital-to-analog converter (DAC);

a current regulation portion connected to the output terminal of the high voltage generator through the first resistive element as well to an enabling terminal which provides an enabling signal, the current regulation portion being supplied by a second voltage reference having a voltage level higher than a voltage level of the first voltage reference;

an input terminal connected to the output terminal of the high voltage generator;

an output terminal connected to the voltage control circuit;

an operational amplifier having a first input terminal connected to the input terminal of the high voltage generator, a second input terminal connected to a first internal node and an output terminal;

a measuring transistor connected between the first internal node and the output terminal of the measuring circuit and having a control terminal connected to the output terminal of the operational amplifier;

the first resistive element, which is connected between the input terminal of the measuring circuit and the first internal node;

a current/voltage converter connected between the output terminal of the measuring circuit and the third voltage reference and providing a measured voltage to the output terminal of the measuring circuit; and the current regulation portion, which includes first and second transistors connected in series to each other, between the second voltage reference and the internal node and having respective control terminals connected to a reference input terminal of the measuring circuit and to the enabling terminal of the current regulation portion, respectively.

2. The high voltage generator of claim 1, wherein the output regulator further comprises:

a resistive divider connected between the output terminal of the high voltage generator and a third voltage reference and comprising the first resistive element and a second resistive element interconnected at a central node in turn connected to the voltage control circuit, wherein the additional current regulation portion comprises a current generator inserted between the second voltage reference and the central node of the resistor divider.

3. The high voltage generator of claim 2, wherein the additional current regulation portion further comprises a switch connected between the current generator and the central node of the resistor divider and connected to the enabling terminal, the switch being controlled by the enabling signal.

4. The high voltage generator of claim 3, wherein the DAC of the output regulator has:

an input terminal connected to a control bus and receiving therefrom a digital control signal; and an output terminal connected by a second bus to the second resistive element which is modulable based on a regulation signal received from the second bus, wherein the enabling signal is an extension bit of a digital control signal provided by a control logic.

5. The high voltage generator of claim 1, wherein the DAC comprises:

a reference current/voltage generator;

a multiple current generator having a reference input terminal connected to the reference current/voltage generator and providing an output current based on a digital control signal; and a current/voltage converter structured to convert the output current into a converted control voltage that is provided to the output terminal of the DAC, the reference current/voltage generator comprising:

an operational amplifier connected to the reference input terminal of the multiple current generator and providing thereto a reference voltage;

an evaluation resistor connected between a second internal node and a third voltage reference; and a pull-up transistor connected between the second voltage reference and the internal node and having a control terminal connected to the output terminal of the operational amplifier and thus to the reference input terminal of the multiple current generator, a reference current flowing through the evaluation resistor and pull-up transistor, wherein a current provided by the current regulation portion is chosen as equal to a multiple of the reference current according to the following relation:

$$I\text{-}DV = m*Ird$$

I-DV being the current provided by the current regulation portion and Ird being the reference current.

6. The high voltage generator of claim 5, wherein the third voltage reference is ground.

7. The high voltage generator of claim 1, wherein the first voltage reference is a band-gap voltage reference.

8. The high voltage generator of claim 1, wherein the second voltage reference is a voltage supply reference.

9. A DAC-controlled high voltage generator, comprising:

an input terminal connected to a first voltage reference;

an output terminal providing an output voltage;

a voltage control circuit and a charge pump circuit connected, in series to each other, between the input and output terminals of the high voltage generator; and an output regulator connected to the output terminal of the high voltage generator and including:

a digital-to-analog converter (DAC);

a measuring circuit that includes:

an input terminal connected to the output terminal of the high voltage generator;

an output terminal connected to the voltage control circuit;

an operational amplifier having a first input terminal connected to the input terminal of the high voltage generator, a second input terminal connected to an internal node, and an output terminal;

a measuring transistor connected between the internal node and the output terminal of the measuring circuit and having a control terminal connected to the output terminal of the operational amplifier;

a first resistive element connected between the input terminal of the measuring circuit and the internal node; and a current/voltage converter connected between the output terminal of the measuring circuit and a second voltage reference and providing a measured voltage to the output terminal of the measuring circuit;

a current regulation portion connected to the input terminal of the measuring circuit through the first resistive element, the current regulation portion including first and second transistors connected in series to each other between a third voltage reference and the internal node and having respective control terminals connected, respectively, to a reference input terminal of the measuring circuit and to an enabling terminal which provides an enabling signal, the third voltage reference having a voltage level higher than a voltage level of the first voltage reference.

10. The high voltage generator of claim 9, wherein the DAC comprises:
- a reference current/voltage generator;
- a multiple current generator having a reference input terminal connected to the reference current/voltage generator and providing an output current based on a digital control signal; and
- a current/voltage converter structured to convert the output current into a converted control voltage that is provided to the output terminal of the DAC, the reference current/voltage generator comprising:
  - an operational amplifier connected to the reference input terminal of the multiple current generator and providing thereto a reference voltage;
  - an evaluation resistor connected between an internal node and the second voltage reference; and
  - a pull-up transistor connected between the third voltage reference and the internal node and having a control terminal connected to the output terminal of the operational amplifier and thus to the reference input terminal of the multiple current generator, a reference current flowing through the evaluation resistor and pull-up transistor, wherein a current provided by the current regulation portion is chosen as equal to a multiple of the reference current according to the following relation:

$$I\text{-}DV = m*Ird$$

I-DV being the current provided by the additional current regulation portion and Ird being the reference current.

11. The high voltage generator of claim 9, wherein the first voltage reference is a band-gap voltage reference.

12. The high voltage generator of claim 9, wherein the second voltage reference is ground.

13. The high voltage generator of claim 9, wherein the third voltage reference is a voltage supply reference.

* * * * *